(12) United States Patent
Nguyen et al.

(10) Patent No.: US 12,191,392 B2
(45) Date of Patent: Jan. 7, 2025

(54) SEMICONDUCTOR DEVICE INCLUDING TWO-DIMENSIONAL MATERIAL

(71) Applicant: Samsung Electronics Co., Ltd., Suwon-si (KR)

(72) Inventors: Van Luan Nguyen, Suwon-si (KR); Minsu Seol, Seoul (KR); Eunkyu Lee, Yongin-si (KR); Junyoung Kwon, Seoul (KR); Hyeonjin Shin, Suwon-si (KR); Minseok Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 176 days.

(21) Appl. No.: 17/505,955

(22) Filed: Oct. 20, 2021

(65) Prior Publication Data

US 2022/0238721 A1   Jul. 28, 2022

(30) Foreign Application Priority Data

Jan. 25, 2021   (KR) .................. 10-2021-0010354

(51) Int. Cl.
*H01L 29/786* (2006.01)
*H01L 29/16* (2006.01)
*H01L 29/24* (2006.01)

(52) U.S. Cl.
CPC .... *H01L 29/78606* (2013.01); *H01L 29/1606* (2013.01); *H01L 29/24* (2013.01)

(58) Field of Classification Search
CPC ........... H01L 29/78606; H01L 29/1606; H01L 29/24; H01L 29/78681; H01L 29/78696; H01L 29/778; H01L 29/786; H01L 21/02439; H01L 21/02527; H01L 21/02568; H01L 21/02587; H01L 29/66045; H01L 29/1602; H01L 21/76841–76876; H01L 23/53223; H01L 23/53238; H01L 23/53252

See application file for complete search history.

(56) References Cited

U.S. PATENT DOCUMENTS

| | | | |
|---|---|---|---|
| 9,647,166 B2 | 5/2017 | Choi et al. | |
| 10,096,735 B2 | 10/2018 | Heo et al. | |
| 2009/0101892 A1* | 4/2009 | Dimitrakopoulos | ........................ H10K 71/191 257/E21.52 |
| 2015/0340522 A1* | 11/2015 | Choi | ..................... H01L 31/032 257/432 |

(Continued)

FOREIGN PATENT DOCUMENTS

| | | | | |
|---|---|---|---|---|
| CN | 107068745 A | * | 8/2017 | |
| CN | 111788700 A | * | 10/2020 | ..... H01L 31/022408 |

(Continued)

OTHER PUBLICATIONS

Deji Akinwande et al., "Graphene and two-dimensional materials for silicon technology," Nature 507, vol. 573, Sep. 26, 2019.

*Primary Examiner* — Shahed Ahmed
(74) *Attorney, Agent, or Firm* — Harness, Dickey & Pierce, P.L.C.

(57) ABSTRACT

A semiconductor device according to an embodiment may include a substrate, an adhesive layer, and a semiconductor layer. The semiconductor layer includes a 2D material having a layered structure. The adhesive layer is interposed between the substrate and the semiconductor layer, and has adhesiveness to a 2D material.

20 Claims, 5 Drawing Sheets

(56) References Cited

U.S. PATENT DOCUMENTS

2018/0129043 A1\*  5/2018  Kim ..................... G06F 3/0416
2018/0148338 A1   5/2018  Yu
2018/0197951 A1   7/2018  Nirmalraj

FOREIGN PATENT DOCUMENTS

| KR | 10-2015-0134166 A | 12/2015 |
| KR | 10-2017-0046386 A | 5/2017 |
| KR | 10-2018-0059331 A | 6/2018 |
| KR | 10-1910278 | 10/2018 |

\* cited by examiner

SEMICONDUCTOR DEVICE INCLUDING TWO-DIMENSIONAL MATERIAL

CROSS-REFERENCE TO RELATED APPLICATION

This application is based on and claims priority under 35 U.S.C. § 119 to Korean Patent Application No. 10-2021-0010354, filed on Jan. 25, 2021, in the Korean Intellectual Property Office, the disclosure of which is incorporated by reference herein in its entirety.

BACKGROUND

1. Field

The present disclosure relates to semiconductor devices including a two-dimensional (2D) material.

2. Description of the Related Art

As the degree of integration of semiconductor devices increases, the size of semiconductor devices included in semiconductor apparatuses further decreases. In order to increase operating speeds of semiconductor devices, attempts have been made to reduce not only contact resistance between semiconductor devices, but also contact resistance between members or layers constituting semiconductor devices (e.g., transistors). As a part of this, a 2D material is employed. A 2D material may have a higher electron mobility compared to a three-dimensional material used in the related art. For example, a transistor employing a 2D material as a channel exhibits a high operating speed compared to a transistor employing a three-dimensional material as a channel.

SUMMARY

In a semiconductor device employing a two-dimensional (2D) material, adhesive force at an interface between a 2D material layer and another material layer is important. If the adhesive force at the interface is low, the 2D material layer may be damaged during a process of manufacturing the semiconductor device.

Provided are semiconductor devices having improved adhesive force at an interface between 2D material and another material layer.

Provided are semiconductor devices having a high performance by including a 2D material.

Provided are semiconductor devices having high performance and operation characteristics.

Additional aspects will be set forth in part in the description which follows and, in part, will be apparent from the description, or may be learned by practice of the presented embodiments of the disclosure.

According to an aspect of an example embodiment, a semiconductor device includes a substrate; a semiconductor layer including a 2D material having a layered structure; and an adhesive layer between the substrate and the semiconductor layer and having adhesiveness to the 2D material.

The adhesive layer may include a metal thin film. The metal thin film may include at least one of copper (Cu), nickel (Ni), gold (Au), or platinum (Pt).

The adhesive layer may include an insulating material layer. The insulating material layer may include a metal oxide layer. The metal oxide layer may include at least one of $TiO_2$ or $HFO_2$. The insulating material layer may include a self-assembled monolayer. The self-assembled monolayer may include a compound having at least one of a $-NH_2$ functional group and a $-SH_2$ functional group.

The 2D material may include at least one of graphene, black phosphorous, or transition-metal dichalcogenide.

The 2D material may include a transition-metal metal and a chalcogenide element. The adhesive layer may include a self-assembled monolayer and may comprise a compound having at least one of a $-NH_2$ functional group or a $-SH_2$ functional group.

The semiconductor device may further include a first electrode in contact with the semiconductor layer; a second electrode in contact with the semiconductor layer and separated from the first electrode; and a third electrode separated from the semiconductor layer. The 2D material may include a transition-metal dichalcogenide.

According to another aspect of an embodiment, a semiconductor device includes: a substrate; a channel layer including a two-dimensional (2D) material; an adhesive layer between the substrate and the channel layer and having adhesiveness to the 2D material; a source electrode in contact with the channel layer; a drain electrode in contact with the channel layer and separated from the source electrode; and a gate electrode separated from the channel layer.

The channel layer may have a layered structure.

The 2D material may include at least one of graphene, black phosphorus, or a transition-metal dichalcogenide.

The adhesive layer may include at least one of copper (Cu), nickel (Ni), gold (Au), or platinum (Pt).

The adhesive layer may include at least one of $TiO_2$ or $HfO_2$.

The adhesive layer may include a self-assembled monolayer. The self-assembled monomolecular film may include a compound including at least one of a $-NH_2$ functional group and a $-SH_2$ functional group.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
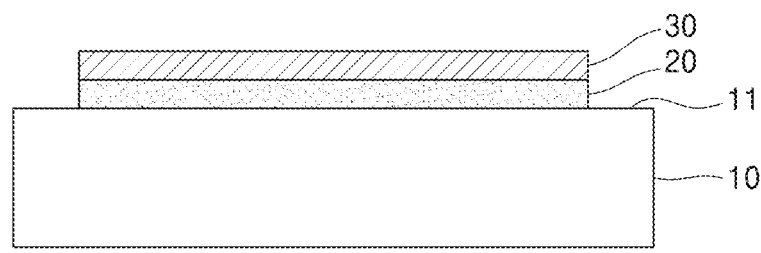
FIG. 1 is a cross-sectional view showing a semiconductor device including a 2D material according to some embodiments.

Reference will now be made in detail to some example embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Hereinafter, semiconductor devices including a 2D material according to embodiments will be described in detail with reference to the accompanying drawings. The widths and thicknesses of layers and regions shown in the accompanying drawings may be exaggerated for convenience of explanation and clarity of the specification. Like reference numerals refer to like elements throughout detailed descriptions.

FIG. 1 is a cross-sectional view showing a semiconductor device including a 2D material according to some embodiments. Referring to FIG. 1, the semiconductor device according to some embodiments may have a structure in which a substrate 10, an adhesive layer 20, and a semiconductor layer 30 are sequentially stacked.

The substrate 10 may have a surface 11 having an insulating property. For example, the substrate 10 may include an insulating substrate and/or may include a semiconductor substrate having an insulating layer on the surface 11. The semiconductor substrate may include, for example, Si, Ge, SiGe, a Group III-V semiconductor material, etc. The substrate 10 may be and/or may include a semiconductor on insulator (e.g., a silicon on insulator (SOI)). The substrate 10 may include, for example, a silicon substrate in which a silicon oxide is formed on the surface 11 of the substrate 10, but is not limited thereto.

The semiconductor layer 30 includes a 2D material. Herein, the 2D material refers to a semiconductor material having a 2D crystal structure. A 2D structure may be in contrast to, e.g., zero-dimensional (0D) structures (e.g., quantum dots (QD)); one-dimensional (1D) structures (e.g., carbon nanotubes and/or a nanowire); and/or three-dimensional (3D) structures.

The 2D material may have a layered structure, and may include a monolayer and/or a multilayer. Each layer constituting the 2D material may have a thickness of an atomic level. For example, each of the layers constituting the 2D material may form a crystal structure in a two-dimensional plane, and though the atoms comprising each layer may exist above and/or below the two-dimensional plane, the two-dimensional lattice of the 2D crystal structure may comprise vertices ordered in a single sheet. In some embodiments, the layers of the 2D materials may be coupled to each other through the van der Waals interactions. In some embodiments, the two-dimensional plane of the 2D material may be parallel to, for example, the surface 11 having an insulating property.

The 2D material may include, for example, at least one of graphene, black phosphorous, and/or transition-metal dichalcogenide (TMD). Graphene is a material having a hexagonal honeycomb structure by 2D bonding of carbon atoms, and has advantages of having high electrical mobility and high thermal property compared to silicon (Si), is chemically stable, and has a large surface area. Black phosphorous is a material in which phosphorous atoms are two-dimensionally bonded. For example, in graphene and black phosphorus atoms of carbon and phosphorus, respectively, may be bonded to three neighboring atoms. In some embodiments, the 2D material may form a hexagonal lattice.

TMD may include, for example, at least one transition-metal (e.g., copper (Cu), molybdenum (Mo), tungsten (W), neodymium (Nb), vanadium (V), tantalum (Ta), titanium (Ti), zirconium (Zr), hafnium (Hf), technetium (Tc), and/or rhenium (Re)) and at least one chalcogen element (e.g., sulfur (S), selenium (Se), and/or tellurium (Te)). For example, the TMD may include CuS, which is a compound of copper (Cu) (which is a transition-metal) and sulfur (S) (which is a chalcogen element). The TMD may include a honeycomb hexagonal lattice structure.

In some embodiments, the TMD may be expressed as, for example, $MX_2$, wherein M represents the transition-metal and X represents the chalcogen element. The TMD may include, for example, a layer of M atoms sandwiched between two layers of X atoms. In some embodiments, M may be Mo, W, Nb, V, Ta, Ti, Zr, Hf, Tc, Re, and/or the like, and X may be S, Se, Te, and/or the like. For example, TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, and/or the like.

In some embodiments, the TMD may be a chalcogenide material including a non-transition-metal. The non-transition-metal may include, for example, post-transition metals and/or metalloids (e.g., gallium (Ga), indium (In), tin (Sn), germanium (Ge), lead (Pb), and/or the like). In this case, the TMD may include a compound of a non-transition-metal, such as Ga, In, Sn, Ge, and/or Pb and a chalcogen element, such as S, Se, and Te. For example, the TMD may include $SnSe_2$, GaS, GaSe, GaTe, GeSe, $In_2Se_3$, $InSnS_2$, and/or the like.

As described above, the TMD may include at least one metal element of Mo, W, Nb, V, Ta, Ti, Zr, Hf, Tc, Re, Cu, Ga, In, Sn, Ge, and/or Pb and at least one chalcogen element of S, Se, and/or Te. However, the materials described above are merely examples, and other materials may also be used as a TMD material.

A 2D material may be doped with a p-type dopant or an n-type dopant to control the mobility of charge carries therein. The p-type dopant and n-type dopant may be, for example, a p-type dopant and an n-type dopant used for graphene and/or carbon nanotubes (CNTs). The p-type dopant and/or the n-type dopant may be doped by using an ion implantation method and/or a chemical doping method and/or manner.

The semiconductor layer 30 may further include an intercalation material inserted into an interlayer of a 2D material, and here, the intercalation material may include, for example, lithium (Li), potassium (K), etc. For example, the intercalation material may include Li atoms, K atoms, and/or both Li atoms and K atoms. Carrier mobility (e.g., electron mobility) in a thickness direction of the semiconductor layer 30 may be increased by the intercalation material. In addition, the intercalation material may lower contact resistance between the semiconductor layer 30 and another material layer bonded thereto (e.g., an electrode).

As described above, the semiconductor layer 30 including a 2D material may improve the performance and operation characteristics of the semiconductor device including the semiconductor layer 30. A semiconductor device having a vertical-type structure using a 2D material may exhibit a relatively high current density even at a low input voltage compared to a horizontal type (e.g., a planar-type) semiconductor device, and thus, may be used as a low power semiconductor device. Also, because a 2D material has a small thickness and a short channel of several tens of nm or less may be easily implemented in a vertical-type device, a manufacturing process of the semiconductor device is easy, and a high-density integrated circuit may be implemented due to the small device size.

However, the adhesive force between the semiconductor layer 30 and the substrate 10 may affect a manufacturing yield of the semiconductor device. For example, the adhesion energy between the 2D material and the insulating surface 11 of the substrate 10 may be very low. For example, when the surface 11 of the substrate 10 includes $SiO_2$, the adhesive energy between $SiO_2$ and the 2D material is about 0.21 $J/m^2$. In a process of transferring a 2D material layer onto the surface 11 of the substrate 10, the 2D material layer may be partly peeled off from the surface 11 of the substrate 10. Also, when patterning the 2D material layer in a subsequent process, for example, a lithography process after the 2D material layer is formed on the surface 11 of the substrate 10, the 2D material layer may be peeled off from the surface 11 of the substrate 10. Therefore, when the 2D material layer is directly formed on the surface 11 of the substrate 10, the 2D material layer may be non-uniform. Enhancement of the adhesive force of the 2D material layer with respect to the substrate 10 is required for securing the mechanical integrity of the manufacturing process of the semiconductor device.

According to the semiconductor device of the present example embodiments, the adhesive layer 20 is interposed between the insulating surface 11 of the substrate 10 and the semiconductor layer 30. The adhesive layer 20 has adhesiveness to a 2D material. For example, the adhesive force between the adhesive layer 20 and the 2D material is greater than the adhesive force between the 2D material and the insulating surface 11 of the substrate 10.

In some embodiments, the adhesive layer 20 may include a metal thin film. The metal thin film may include a metal having adhesive force with respect to a 2D material greater than the adhesive force between the 2D material and the insulating surface 11 of the substrate 10. For example, the metal may include at least one of copper (Cu), nickel (Ni), gold (Au), and/or platinum (Pt). The metal thin film may be a single metal thin film or may be a thin film including two or more metals. In some embodiments, the metal thin film may be a multilayer metal thin film including different metals from each other.

Figure 2:
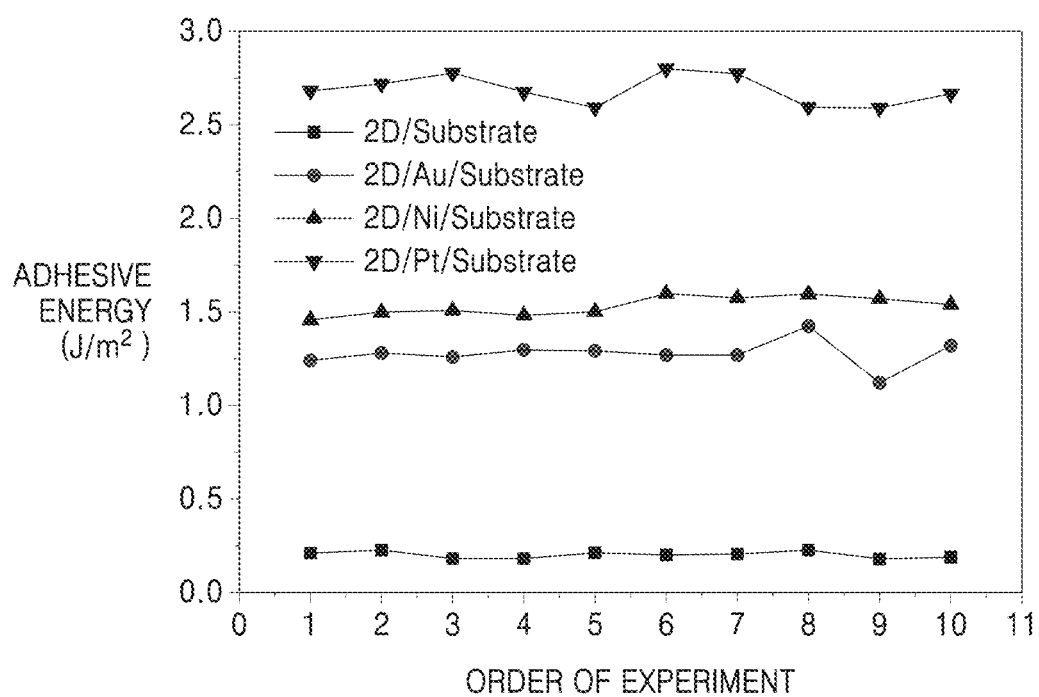
FIG. 2 is a graph showing results of measuring adhesive energy of a structure in which a 2D material layer is formed on a metal thin film.

FIG. 2 is a graph showing results of measuring adhesive energy of a structure in which a 2D material layer is formed on a metal thin film. In FIG. 2, a 2D/substrate is a case in which a 2D material layer is formed on the substrate 10, and a 2D/Au/Substrate, a 2D/Ni/Substrate, and a 2D/Pt/Substrate are cases in which the adhesive layer 20 including gold (AU), the adhesive layer 20 including nickel (Ni), and the adhesive layer 20 including platinum (Pt) are used, respectively. In FIG. 2, the substrate 10 is a Si substrate, and the 2D material is $MoS_2$ and $WS_2$.

Referring to FIG. 2, when a 2D material layer is formed directly on the substrate 10, the adhesive energy may be about 0.2 $J/m^2$. When the adhesive layer 20 including gold (Au), the adhesive layer 20 including nickel (Ni), and the adhesive layer 20 including platinum (Pt) are used, the adhesive energy may be about 1.2 $J/m^2$, 1.5 $J/m^2$, and 2.6 $J/m^2$, respectively, and it may be seen that the adhesive energy is about 6 times, 7.5 times, and 13 times, respectively, compared to the case when a 2D material layer is directly formed on the substrate 10. Accordingly, peel-off of the 2D material layer in a process of transferring a 2D material layer to the adhesive layer 20 and peel-off of the 2D material layer in a subsequent patterning process after transferring may be reduced, and thus, a uniform 2D material layer may be formed.

In some embodiments, the adhesive layer 20 may include an insulating material layer. For example, the insulating material layer may include a metal oxide layer and/or self-assembled monolayers (SAMs). The metal oxide layer may include a metal oxide having adhesive force with respect to a 2D material greater than the adhesive force between the 2D material and the insulating surface 11 of the substrate 10. The metal oxide may include a high-k dielectric material having a high dielectric constant. For example, the metal oxide may include at least one of titanium oxide (e.g., $TiO_2$) and/or hafnium oxide (e.g., $HfO_2$). The metal oxide layer may be a layer including a single metal oxide, and/or may be a layer including two or more metal oxides. The metal oxide layer may have a multilayer structure including different metal oxides from each other.

Figure 3:
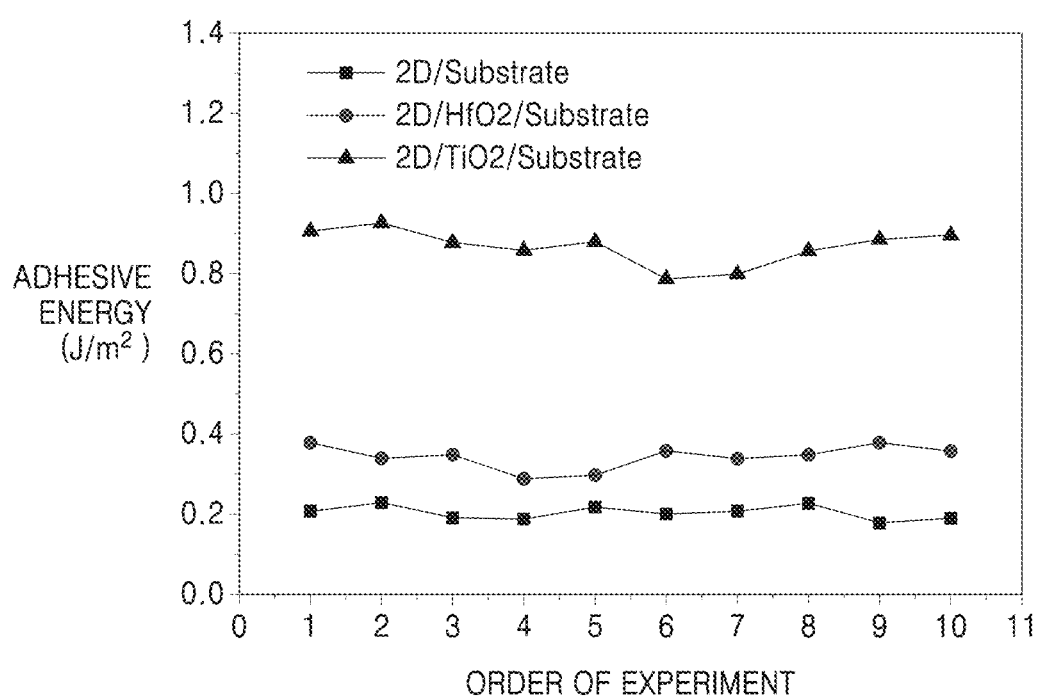
FIG. 3 is a graph showing results of measuring adhesive energy of a structure in which a 2D material layer is formed on a metal oxide layer.

FIG. 3 is a graph showing results of measuring adhesive energy of a structure in which a 2D material layer is formed on a metal oxide layer. In FIG. 3, a 2D/substrate is a case in which a 2D material layer is formed on the substrate 10, and 2D/HfO2/Substrate, 2D/TiO2/Substrate are cases in which $TiO_2$ and $HfO_2$ are applied to the adhesive layer 20, respectively. In FIG. 3, the substrate 10 is a SiO2 substrate and a Si substrate, and the 2D material is $MoS_2$ and $WS_2$.

Referring to FIG. 3, when the 2D material layer is directly formed on the substrate 10, the adhesive energy is about 0.2 J/m2. When the adhesive layer 20 including $HfO_2$ and the adhesive layer 20 including $TiO_2$ are used, the adhesive energy is about 0.35 $J/m^2$ and 0.95 $J/m^2$, respectively, and it may be seen that the adhesive energy is about 1.75 times and 4.75 times, respectively, compared to the case when a 2D material layer is directly formed on the substrate 10. Accordingly, peel-off of the 2D material layer in a process of transferring a 2D material layer to the adhesive layer 20 and peel-off of the 2D material layer in a subsequent patterning process after transferring may be reduced, and thus, a uniform 2D material layer may be formed.

In some embodiments, the self-assembled monolayer (SAM) may refer to an organic monolayer spontaneously formed on a surface of a solid. The self-assembled monolayers may comprise a compound include a head group, a hydrocarbon chain, and a terminal group. The head group may be chemically adsorbed on a surface of a solid to form monolayers. The hydrocarbon chain allows the monolayers to be aligned by the Van der Waals interaction. The terminal group includes functional groups. The functional group is a part of the SAM that enables the application of the SAM, and the present embodiment employs an SAM having a functional group having adhesive force with respect to a 2D material. For example, a self-assembled monolayer having at least one of a $-NH_2$ functional group and a $SH_2$ functional group may be employed as an insulating material layer. If only an ionic bond exists between the surface 11 of the substrate 10 and the adhesive layer 20, it may be difficult to form a strong and/or stable molecular film. However, in the case of the self-assembled monolayer, because a chemical bond is formed between the surface 11 of the substrate 10 and the molecules of the head group constituting the monolayer, a very strong molecular film, (e.g., a strong adhesive layer 20) may be formed. Also, the functional group of the monolayer and the 2D material may be combined with strong adhesive force. Accordingly, as a result, the self-assembled monolayer is strongly bonded to the surface 11 of the substrate 10 and the 2D material layer, and thus, the adhesive force of the 2D material layer may be enhanced. In some embodiments, the SAM may include ordered (e.g., crystalline and/or semi-crystalline) regions.

Figure 4:
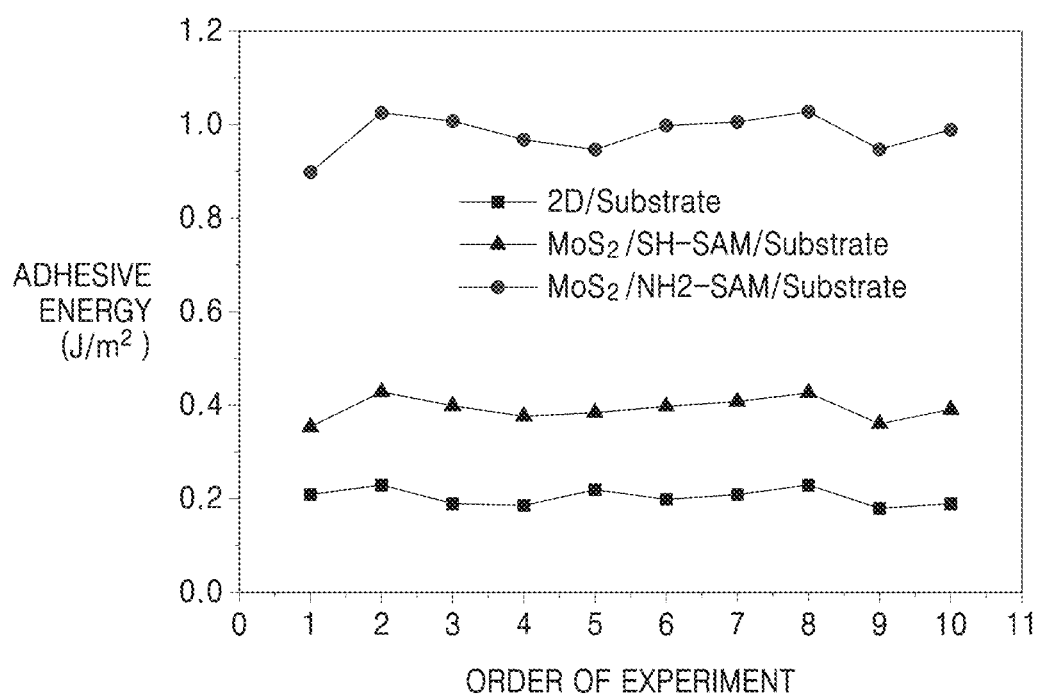
FIG. 4 is a graph showing results of measuring adhesive energy of a structure in which a 2D material layer is formed on self-assembled monolayers.

FIG. 4 is a graph showing results of measuring adhesive energy of a structure in which a 2D material layer is formed on a self-assembled monolayer. In FIG. 4, a 2D/substrate is a case in which a 2D material layer is formed on the substrate 10. $MoS_2$/SH-SAM/Substrate and $MoS_2$/NH-SAM/Substrate are cases in which a self-assembled monolayer having, respectively, a —SH functional group and a self-assembled monolayer having an —NH functional group are applied as the adhesive layer 20, respectively. In FIG. 4, the substrate 10 is a Si substrate, and the 2D material is $MoS_2$.

Referring to FIG. 4, when the 2D material layer is directly formed on the substrate 10, the adhesive energy is about 0.2 $J/m^2$. When the self-assembled monolayer having a —SH functional group and the self-assembled monolayer having an —NH functional group are applied as the adhesive layer 20, adhesive energy is 0.4 $J/m^2$ and 1.0 $J/m^2$, respectively, and it may be seen that the adhesive energy is about 2 times and 5 times compared to the case when the 2D material layer is directly formed on the substrate 10. Accordingly, peel-off of the 2D material layer in a process of transferring a 2D material layer to the adhesive layer 20 and peel-off of the 2D material layer in a subsequent patterning process after transferring may be reduced, and thus, a uniform 2D material layer may be formed.

The semiconductor device having the structure described above may be used as various types of field-effect transistors. FIGS. 5 to 8 are schematic configurations of semiconductor devices according to some example embodiments. Referring to FIGS. 5 to 8, the semiconductor device may include a substrate 110, an adhesive layer 120, a channel layer 130, a source electrode (e.g., a first source/drain electrode) 140 and a drain electrode (e.g., a second source/drain electrode) 150 in contact with the channel layer 130, and a gate electrode (third electrode) 160 separated from the channel layer 130. The channel layer 130 may be a semiconductor layer (e.g., the semiconductor layer 30 of FIG. 1). The source electrode (first electrode) 140 and the drain electrode (second electrode) 150 are separated from each other.

The substrate 110 may be an insulating substrate, and/or may be a semiconductor substrate having an insulating surface (gate insulating film) 111. The semiconductor substrate may include, for example, Si, GE, SiGe a Group III-V semiconductor material, and/or the like. The substrate 110 may include, for example, a silicon substrate having a silicon oxide formed on the surface 111 of the substrate 110, but is not limited thereto.

The adhesive layer 120 is provided on the surface 111 of the substrate 110. The channel layer 130 is formed on the adhesive layer 120. The channel layer 130 includes a 2D material. As discussed above, the 2D material may refer to a semiconductor material having a 2D crystal structure. The 2D material may include a layered structure, and may include a monolayer and/or a multilayer structure. Each layer constituting the 2D material may have a thickness of an atomic level. By interposing the adhesive layer 120 between the substrate 110 and the channel layer 130, the peeling of the channel layer 130 during a manufacturing process may be reduced or prevented, and thus, the channel layer 130 having a uniform layered structure of a 2D material may be formed.

The 2D material may include, for example, at least one of graphene, black phosphorous, and/or transition-metal dichalcogenide (TMD). The TMD may include, for example, at least one transition-metal (e.g., Cu, Mo, W, Nb, V, Ta, Ti, Zr, Hf, Tc, and/or Re) and at least one chalcogen element (e.g., S, Se, and/or Te). For example, the TMD may include CuS, which is a compound of copper (Cu) (which is a transition-metal) and sulfur (S) (which is a chalcogen element).

In some embodiments, the TMD may be expressed as, for example, $MX_2$, wherein M represents a transition-metal and X represents a chalcogen element. In this case, M may be Mo, W, Nb, V, Ta, Ti, Zr, Hf, Tc, Re, and/or the like, and X may be S, Se, Te, and/or the like. For example, TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, and/or the like.

In some embodiments, the TMD may be a chalcogenide material including a non-transition-metal. The non-transition-metal may include, for example, Ga, in, Sn, Ge, Pb, and/or the like. In this case, the TMD may include a compound of a non-transition-metal, such as Ga, In, Sn, Ge, and/or Pb and a chalcogen element, such as S, Se, and/or Te. For example, the TMD may include $SnSe_2$, GaS, GaSe, GaTe, GeSe, $In_2Se_3$, $InSnS_2$, and/or the like. However, the materials described above are merely examples, and other materials may also be used as a TMD material.

The 2D material may be doped with a p-type dopant or an n-type dopant to control the mobility of charge carriers therein. The p-type dopant and n-type dopant may be, for example, a p-type dopant and an n-type dopant used for graphene and/or CNTs. The p-type dopant and/or the n-type dopant may be doped by using an ion implantation method and/or a chemical doping method and/or manner.

The channel layer 130 may further include an intercalation material inserted into an interlayer of a 2D material, and here, the intercalation material may include, for example, lithium (Li), potassium (K), etc. For example, the intercalation material may include Li atoms, K atoms, and/or both Li atoms and K atoms. Carrier mobility (e.g., electron mobility) in a thickness direction (e.g., in a direction with a vertical direction compared to the 2D plane of the 2D material) of the channel layer 130 may be increased by the intercalation material, and thus, the performance and operation characteristics of the semiconductor device may be improved.

The adhesive layer 120 has adhesiveness to the 2D material and/or the substrate 110. For example, the adhesive force between the adhesive layer 120 and the 2D material is greater than the adhesive force between the 2D material and the insulating surface 111 of the substrate 110. As discussed above, in some embodiments, the adhesive layer 120 may include at least one of a metal thin film and/or an insulating material layer. The metal thin film may include a metal having adhesive force, with respect to a 2D material, greater than the adhesive force between the 2D material and the insulating surface 111 of the substrate 110. For example, the metal may include at least one of copper (Cu), nickel (Ni), gold (Au), and/or platinum (Pt). The metal thin film may be a single metal thin film or may be a thin film including two or more metals. The metal thin film may be a multilayer thin film including different metals from each other.

In some embodiment, the insulating material layer may include a metal oxide layer and/or SAM(s). The metal oxide layer may include a metal oxide having adhesive force with respect to a 2D material greater than the adhesive force between the 2D material and the insulating surface 111 of the substrate 110. For example, the metal oxide may include at least one of $TiO_2$ and $HfO_2$. The metal oxide layer may be a layer including a single metal oxide, or may be a layer including two or more metal oxides. The metal oxide layer may have a multilayer structure including different metal oxides from each other.

The SAM may refer to an organic monolayer and/or a monolayer including an organic component spontaneously formed on a surface of a solid. The SAM may include a functional group having adhesive force with respect to a 2D material. For example, an SAM having at least one of a $—NH_2$ functional group and a $—SH_2$ functional group may be employed as and/or included in the insulating material layer.

Figure 5:
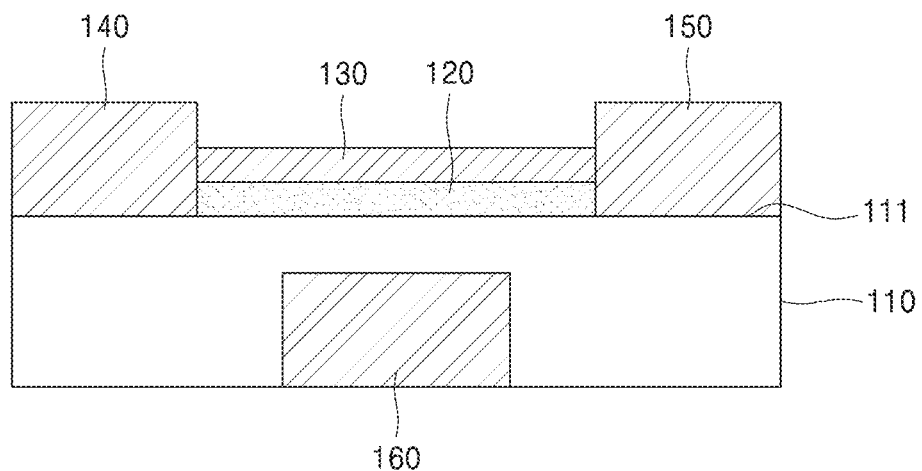
FIG. 5 is a schematic configuration of a semiconductor device according to some embodiments.
Figure 6:
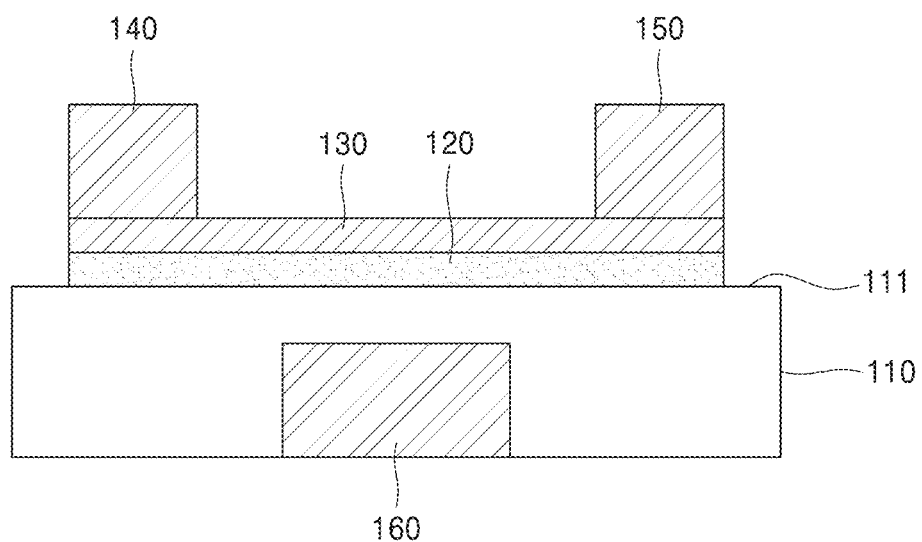
FIG. 6 is a schematic configuration of a semiconductor device according to some embodiments.
Figure 7:
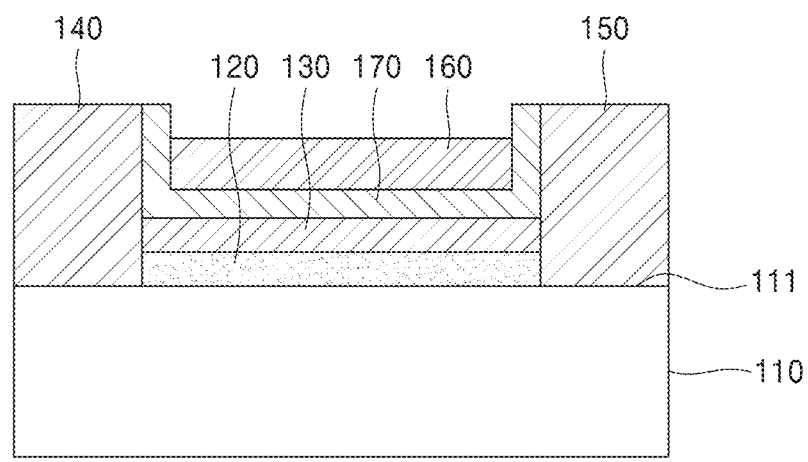
FIG. 7 is a schematic configuration of a semiconductor device according to some embodiments.
Figure 8:
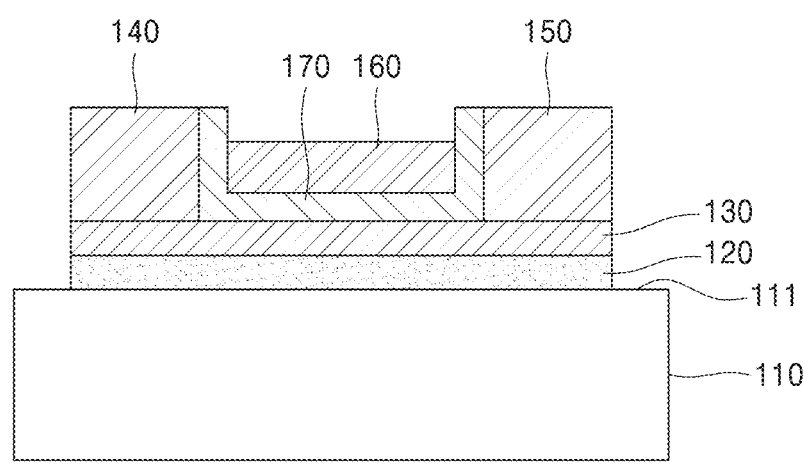
FIG. 8 is a schematic configuration of a semiconductor device according to some embodiments.

The adhesive layer 120 including a metal thin film may be applied to the semiconductor devices illustrated in FIGS. 6 to 8, according to the embodiments. The adhesive layer 120 including the insulating material layer may be applied to the semiconductor device shown in FIGS. 5 to 8, according to the embodiments.

The source electrode 140 and the drain electrode 150 are arranged to be in contact with the channel layer 130. The drain electrode 150 is separated from the source electrode 140. For example, referring to FIGS. 5 and 7, the source electrode 140 and the drain electrode 150 may be arranged to be separated in a transverse direction with the channel layer 130 therebetween. The source electrode 140 and the drain electrode 150 may contact opposite ends of the channel layer 130 in the transverse direction, respectively. For example, referring to FIGS. 6 and 8, the source electrode 140 and the drain electrode 150 are arranged to be separated from each other in the transverse direction on an upper surface of the channel layer 130.

The source electrode 140 and/or the drain electrode 150 may include a metal material having high electrical conductivity. For example, the source electrode 140 and the drain electrode 150 may include a metal, such as magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), bismuth (Bi), etc. and/or an alloy of these metals.

The gate electrode 160 faces the channel layer 110 with an insulating layer therebetween. For example, referring to FIGS. 5 and 6, the gate electrode 160 may be located on an opposite side of the channel layer 130 with the substrate 110 therebetween. The insulating surface 111 of the substrate 110 may function as a gate insulating film that insulates between the channel layer 130 and the gate electrode 160 to suppress a leakage current. Referring to FIGS. 7 and 8, in some embodiments, a gate insulating film 170 may be arranged on an upper surface of the channel layer 130, and the gate electrode 160 is arranged on an upper surface of the gate insulating film 170. In FIGS. 5 and 6, the insulating surface 111 of the substrate 110 also insulates between the gate electrode 160 and the source electrode 140 and between the gate electrode 160 and the drain electrode 150. In FIGS. 7 and 8, the gate insulating film 170 also insulates between the gate electrode 160 and the source electrode 140 and between the gate electrode 160 and the drain electrode 150.

The gate electrode 160 may include a conductor such as a metal material and/or a conductive oxide. For example, the gate electrode 160 may include at least one selected of Al, Cu, Ag, Au, Ti, Ti, TiN, TaN, W, Mo, Wn, Pt, Ni and/or the like. The conductive oxide may include, for example, indium tin oxide (ITO), indium zinc oxide (IZO), etc. The gate electrode 160 may include the same material as the source electrode 140 and the drain electrode 150. The gate insulating layer 170 may include a high-k dielectric material having a high dielectric constant. For example, the dielectric constant of the gate insulating layer 180 may be greater than or equal to the dielectric constant of silicon oxide. The gate insulating film 170 may include, for example, aluminum oxide, hafnium oxide, zirconium hafnium oxide, lanthanum oxide, etc. but is not limited thereto.

As described above, in the semiconductor device according to the present embodiment, the channel layer 130 including a 2D material is formed on the adhesive layer 120. Accordingly, the channel layer 130 of a uniform quality may be formed. A semiconductor device having a vertical-type structure using a 2D material may exhibit a relatively high current density even at a low input voltage compared to a horizontal type semiconductor device, and thus, may be used as a low power semiconductor device. Also, because a 2D material may have a small thickness and, in a vertical-type semiconductor device, a short channel of several tens of nm or less may be readily implemented by using the 2D material, a manufacturing process of the semiconductor device is easy, and a high-density integrated circuit may be implemented due to the small device size.

Manufacturing yield of a semiconductor device may be increased by improving adhesive force at an interface of a 2D material.

A semiconductor device having high performance and operation characteristics with high carrier mobility may be implemented.

While the embodiments have been described in detail, the descriptions should be interpreted as examples of specific embodiments rather than limiting the scope of the inventive concept, therefore, the scope of the inventive concept is not defined by the detailed descriptions but by the appended claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
   a substrate;
   a semiconductor layer comprising a two-dimensional (2D) material having a layered structure;
   an adhesive layer adhering the substrate to the semiconductor layer; and
   an electrode spaced apart from the semiconductor layer such that an insulator separates the electrode and the semiconductor layer and such that the electrode corresponds to a channel region in the semiconductor layer, and wherein an adhesive energy between the adhesive layer and the 2D material is two or more times greater than an adhesive energy between the substrate and the 2D material.

2. The semiconductor device of claim 1, wherein the adhesive layer comprises a metal thin film.

3. The semiconductor device of claim 2, wherein the metal thin film comprises at least one of copper (Cu), nickel (Ni), gold (Au), or platinum (PT).

4. The semiconductor device of claim 1, wherein the adhesive layer comprises an insulating material layer.

5. The semiconductor device of claim 4, wherein the insulating material layer comprises a metal oxide layer.

6. The semiconductor device of claim 5, wherein the metal oxide layer comprises $TiO_2$.

7. The semiconductor device of claim 4, wherein the insulating material layer comprises a self-assembled monolayer.

8. The semiconductor device of claim 7, wherein the self-assembled monolayer comprises a compound having at least one of a —$NH_2$ functional group or a —$SH_2$ functional group.

9. The semiconductor device of claim 1, wherein the 2D material comprises at least one of graphene, black phosphorous, or a transition-metal dichalcogenide.

10. The semiconductor device of claim 1, wherein the 2D material comprises a transition-metal element and a chalcogen element.

11. The semiconductor device of claim 10, wherein
the adhesive layer comprises a self-assembled monolayer, and
the self-assembled monolayer comprises a compound having at least one of a —$NH_2$ functional group or a —$SH_2$ functional group.

12. The semiconductor device of claim 1, further comprising:
a first electrode in contact with the semiconductor layer; and
a second electrode in contact with the semiconductor layer and separated from the first electrode, and
wherein the electrode corresponding to the channel region is between the first and second electrodes.

13. The semiconductor device of claim 11, wherein the 2D material comprises a transition-metal dichalcogenide.

14. A semiconductor device comprising:
a substrate;
a channel layer including a 2D material;
an adhesive layer adhering the substrate to the channel layer, wherein an adhesive energy between the adhesive layer and the 2D material is two or more times greater than an adhesive energy between the substrate and the 2D material;
a source electrode in contact with the channel layer;
a drain electrode in contact with the channel layer and separated from the source electrode; and
a gate electrode separated from the channel layer.

15. The semiconductor device of claim 14, wherein the channel layer has a layered structure.

16. The semiconductor device of claim 15, wherein the 2D material comprises at least one of graphene, black phosphorus, or a transition-metal dichalcogenide.

17. The semiconductor device of claim 16, wherein the adhesive layer comprises at least one of copper (Cu), nickel (Ni), gold (Au), or platinum (PT).

18. The semiconductor device of claim 16, wherein the adhesive layer comprises $TiO_2$.

19. The semiconductor device of claim 16, wherein the adhesive layer comprises a self-assembled monolayer.

20. The semiconductor device of claim 19, wherein the self-assembled monolayer comprises a compound including at least one of a —$NH_2$ functional group or a —$SH_2$ functional group.

* * * * *